(12) United States Patent
Sone et al.

(10) Patent No.: US 6,238,527 B1
(45) Date of Patent: May 29, 2001

(54) THIN FILM FORMING APPARATUS AND METHOD OF FORMING THIN FILM OF COMPOUND BY USING THE SAME

(75) Inventors: Kazuho Sone, Chiba; Nobumasa Suzuki, Yokohama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/162,725

(22) Filed: Sep. 30, 1998

(30) Foreign Application Priority Data

Oct. 8, 1997 (JP) .................................................... 9-275907

(51) Int. Cl.[7] .................................................. C23C 14/34
(52) U.S. Cl. ............................... 204/192.12; 204/192.22; 204/192.23; 204/192.25; 204/192.26; 204/298.06; 204/298.07; 204/298.11; 204/298.14; 204/298.15; 204/298.16; 204/298.26; 204/298.28
(58) Field of Search ..................... 204/192.12, 192.22, 204/192.23, 192.26, 192.27, 192.28, 192.25, 298.06, 298.07, 298.11, 298.14, 298.15, 298.16, 298.26, 298.28

(56) References Cited

U.S. PATENT DOCUMENTS

| | | | |
|---|---|---|---|
| 4,392,931 | * | 7/1983 | Maniv et al. .................... 204/298.07 |
| 5,006,219 | * | 4/1991 | Latz et al. ........................ 204/298.16 |
| 5,178,739 | * | 1/1993 | Barnes et al. .................... 204/192.12 |
| 5,397,448 | * | 3/1995 | Gesche et al. ................... 204/298.16 |
| 5,415,753 | * | 5/1995 | Hurwitt et al. .................. 204/298.11 |
| 5,431,799 | * | 7/1995 | Mosely et al. ................... 204/298.11 |
| 5,433,787 | | 7/1995 | Suzuki et al. ......................... 118/723 |
| 5,487,875 | * | 1/1996 | Suzuki ............................. 422/186.05 |
| 5,585,148 | | 12/1996 | Suzuki et al. ......................... 497/572 |
| 5,660,693 | * | 8/1997 | Abramson et al. ............. 204/298.11 |

FOREIGN PATENT DOCUMENTS

| | | |
|---|---|---|
| 62056570 | 3/1987 | (JP) . |
| 62-274067 | 11/1987 | (JP) . |
| 6041733A | 2/1994 | (JP) . |
| 7335553A | 12/1995 | (JP) . |

* cited by examiner

*Primary Examiner*—Rodney McDonald
(74) *Attorney, Agent, or Firm*—Fitzpatrick, Cella, Harper & Scinto

(57) ABSTRACT

A film forming apparatus for forming a minute thin film at a high depositing rate, which comprises a substrate holding means for holding a substrate, a target holding means for holding a target, a gas supply means for supplying a sputtering gas for sputtering the target into a reaction chamber, and an electric power supply means for supplying an electric power for causing an electric discharge between the target and the substrate, wherein a partition member having a plurality of openings provided between the target and the substrate, and wherein means for supplying a reaction gas and a microwave are provided in a space between the partition member and the substrate.

19 Claims, 5 Drawing Sheets

THIN FILM FORMING APPARATUS AND METHOD OF FORMING THIN FILM OF COMPOUND BY USING THE SAME

BACKGROUND OF THE INVENTION

1. Field of the Invention

The present invention relates to a thin film forming apparatus and more specifically a thin film forming method suitable for forming electrodes and protective films for semiconductor devices, electrodes and protective films for liquid crystal apparatus, protective films for photomagnetic recording media, and antireflective films and reflection enhancing films for optical articles.

2. Related Background Art

Sputtering is known as one of thin film forming methods.

In a conventional reactive sputtering, a gas mixture of a sputtering gas and a reaction gas is introduced into a reaction chamber, and a compound target or a metal target is sputtered to form a thin film of a metal compound by a chemical reaction between atoms constituting a target and a reaction gas. A depositing rate is generally low for an insulating compound target, though electric discharge can be caused by supplying a high-frequency electric power such as of RF or microwave. For a metal target, it is possible to cause electric discharge by supplying a DC voltage, thereby enhancing a depositing rate.

Even when a target is made of a metal, a reaction gas reacts with the metal target on a surface thereof, thereby forming a metallic compound on the surface of the target. Since the sputtering yield with respect to a metallic compound is about 10% of the sputtering yield with respect to a metal, the deposition rate is small in reactive sputtering. Even in case of a compound target, since the thin film formed from the compound has a high content of metal atoms, it is necessary to add a reaction gas for obtaining a film which has a composition close to a stoichiometric ratio of the compound. When the flow rate of a reaction gas decreases in the case of a metal target, a formed thin film of a metallic compound has a large content of metal atoms, whereby the formed film cannot satisfy a stoichiometric ratio thereof and is inferior in its optical characteristics (refractive index, transmittance, etc.) and so on.

Accordingly, there have been proposed several attempts made to solve such a technical problem.

Figure 6:
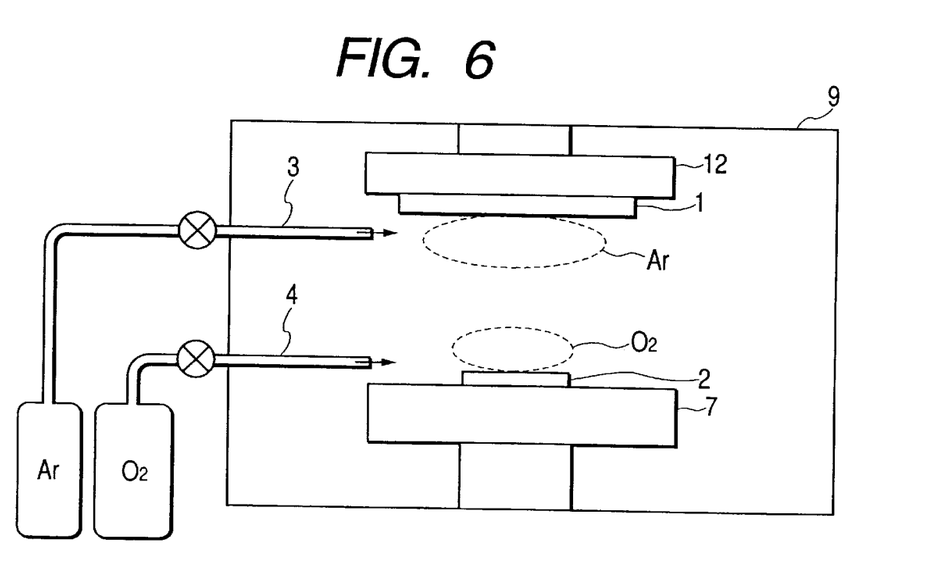
FIG. 6 is a schematic view showing an example of conventional reactive sputtering apparatus.

FIG. 6 is a schematic view of a reactive sputtering apparatus disclosed by Japanese Patent Application Laid-Open No. 62-56570. A reference numeral 1 indicates a target, 2 a substrate, 3 a tube for supplying argon (Ar) to be used as a sputtering gas, 4 a tube for supplying oxygen ($O_2$) to be used as a reaction gas, 9 a reaction chamber, 12 a target holder and 7 a substrate holder.

According to the application mentioned above, it is reported that use of the apparatus shown in FIG. 6 enhances a sputtering rate and improves characteristics of an oxide since it introduces the sputtering gas and the reaction gas separately, thereby causing sputtering preferentially in the vicinity of the target and allowing an oxidizing reaction to take place preferentially in the vicinity of the substrate.

In actuality, however, the sputtering gas is mixed with the reaction gas between the target and the substrate, thereby producing plasma of a mixture of both the gases. When a thin film is to be formed on the substrate of a large area in particular, a discharge region is large between the substrate and the target. Therefore, improvement of a film quality and increase of a sputtering rate cannot be expected.

Figure 7:
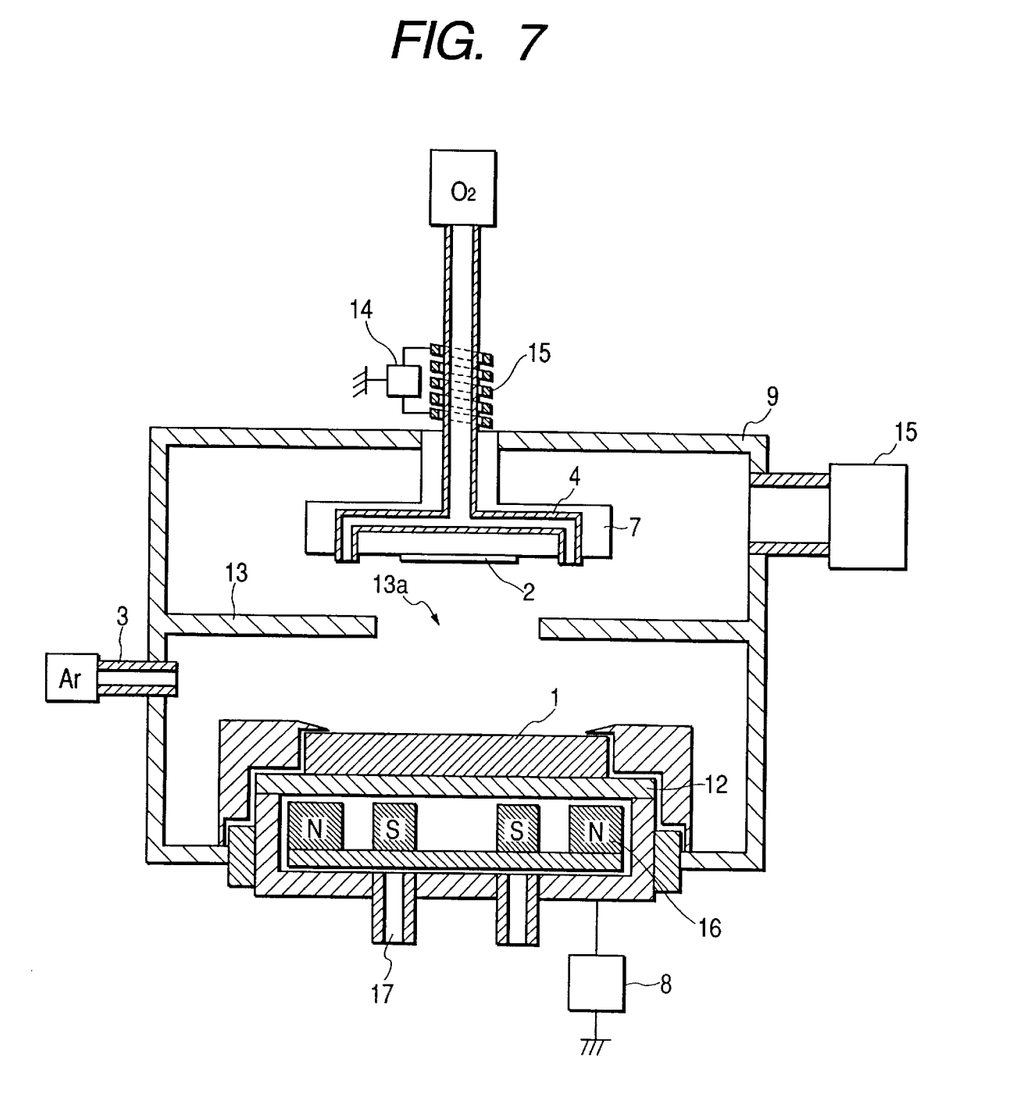
FIG. 7 is a schematic view showing another example of conventional reactive sputtering apparatus.

On the other hand, FIG. 7 shows a schematic view of a reactive sputtering apparatus disclosed by Japanese Patent Application Laid-Open No. 6-41733. A reference numeral 1 indicates a target, 2 a substrate, 3 a tube for supplying argon to be used as a sputtering gas, 4 a tube for supplying oxygen to be used as a reaction gas, 9 a reaction chamber, 12 a target holder, 7 a substrate holder, 8 a power source, 13 a differential pressure plate, 14 a high-frequency power source, 15 an exhaust pump, 16 magnets and 17 a tube for circulating a refrigerant.

In this apparatus, an attempt is made to separate a sputtering gas from a reaction gas by providing an exhaust opening communicating with a vacuum pump in an upper section of the reaction chamber 9 and by generating a pressure difference between the upper section of the reaction chamber and a lower section of the reaction chamber by utilizing the differential pressure plate 13.

Japanese Patent Application Laid-Open No. 7-335553 discloses a reactive sputtering apparatus which has been proposed to achieve an object different from that of the above-mentioned apparatus. In this apparatus, a collimator having a high aspect ratio is provided between a target and a substrate so as to fill a contact hole of a semiconductor device, thereby narrowing an angle which allows sputtered component atoms of the target to be incident onto a surface of the substrate.

However, the apparatus shown in FIG. 7 enlarges a region of discharge since the differential pressure plate 13 has an opening 13a which is larger than the substrate 2 and a sputtering gas actually flows to the substrate 2 through the opening 13a of the differential pressure plate 13. Accordingly, improvement of a sufficient sputtering rate or film characteristics cannot be as expected. Further, this apparatus requires preliminary excitation of oxygen with a high frequency power source 14, an inside surface of a reaction gas supply tube 4 is sputtered due to the preliminary excitation, thereby resulting in a detrimental effect that a component substance such as iron of a reaction gas supply tube is incorporated into a film to be formed.

Further, this apparatus is apt to allow the substrate to be excessively heated by sputtered particles which jump into the substrate.

Any of the above methods adopted for the attempts cannot be used as a method of forming a minute film at a great rate.

Describing an example which is easy to understand, there results in a phenomenon that a refractive index is lower than a designed value when a film is formed of a transparent material such as an alumina.

SUMMARY OF THE INVENTION

An object of the present invention is to provide a thin film forming apparatus and a thin film forming method which are capable of forming a minute film at a large rate by using a microwave.

Another object of the present invention is to provide a thin film forming apparatus and a thin film forming method which are capable of forming a thin film having a uniform thickness and optical characteristics or electrical characteristics which are uniform in the plane of the film.

Still another object of the present invention is to provide a thin film forming apparatus and a thin film forming method which are capable of forming a uniform thin film having a large area.

The film forming apparatus of the present invention comprises: a substrate holding means for holding a substrate, a raw material holding means for holding a raw material, a gas supply means for supplying a sputtering gas to be used for sputtering the raw material, and an electric power supply means for supplying an electric power used to cause an electric discharge in a space between the raw material and the substrate, wherein a partition member having a plurality of openings is provided between the raw material and the substrate, and a microwave supply means for supplying a microwave is provided in a space between the partition member and the substrate.

Further, the film forming method of the present invention which is conducted by forming a thin film of a compound by using an apparatus which comprises a substrate holding means for holding a substrate, a raw material holding means for holding a raw material, a gas supply means for supplying a sputtering gas to be used for sputtering the raw material, and an electric power supply means for supplying an electric power to cause an electric discharge in a space between the raw material and the substrate, which method comprises providing the substrate and the raw material with interposition of a partition member having a plurality of openings, and supplying a sputtering gas into a space between the raw material and the partition member to cause an electric discharge at least between the raw material and the partition member and supplying a microwave into a space between the partition member and the substrate to form a film containing atoms constituting the raw material on the substrate.

DETAILED OF DESCRIPTION OF THE PREFERRED EMBODIMENTS

Figure 1:
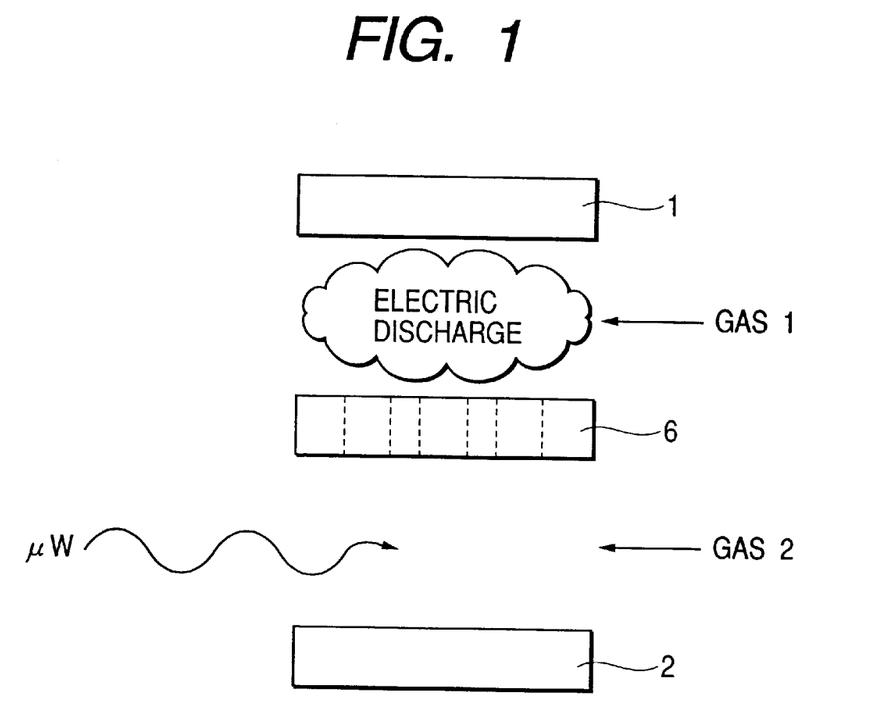
FIG. 1 is a schematic diagram illustrating a fundamental configuration of the present invention.

FIG. 1 is a schematic diagram for explaining a fundamental embodiment of the present invention.

A reference numeral 1 indicates a raw material used as a sputtering target, 2 a substrate on which a film is to be formed, and 6 a partition member.

A sputtering gas GAS1 is supplied into a space between the raw material 1 and the partition member 6. The sputtering gas GAS1 causes an electric discharge in the space with an electric energy, thereby sputtering the raw material 1.

Particles produced by the sputtering pass through openings formed in the partition member 6, and reach a space between the partition member 6 and the substrate 2.

Since a reaction gas GAS2 is supplied into this space, the sputtered particles of the raw material react with the reaction gas in the vicinity of the substrate 2 or on a surface of the substrate 2.

Since a microwave is supplied into the space on the side of the substrate 2, the reaction gas is ionized and/or activated by an energy of the microwave, thereby strongly reacting with the particles of the raw material.

According to the present invention, the partition member serves to separate a plasma of the sputtering gas from the surface of the substrate, thereby preventing adverse influences on a film to be formed. Since the energy of the microwave is supplied to the vicinity of the substrate, the activation of the reaction gas is accelerated due to excitation and ionization.

Since the partition member captures a part of a large amount of sputtered atoms which constitute the target, it is possible to prevent the substrate from being excessively heated by the sputtered atoms of the target which jump into the substrate. Further, it possible to apply a DC voltage to the partition member, thereby preventing detrimental ions from penetrating the surface of the substrate from a side of the target.

By combining the partition member with the supply of the microwave as described above, it is possible to accelerate the reaction between the sputtered particles and the reactive gas on a surface of a substrate, thereby forming a thin film having a large area at a large rate. Further, it is possible to form a thin film of a compound having a uniform thickness and optical characteristics or electrical characteristics which are uniform in the plane of the film. Further, the present invention makes it possible to easily form a thin film of a compound having a high refractive index such as aluminium oxide though it is usually regarded as relatively difficult to form a thin film of such a compound.

Items such as methods of supplying the sputtering gas and the reaction gas, and a method of supplying the microwave which have not been described above with reference to FIG. 1 are not limitative in particular for the present invention.

It is needless to say that each of the components of the apparatus can be modified referring to configurations described later in order to enhance film quality, depositing speed and repeatability.

(Reactive Sputtering Apparatus)

Figure 2:
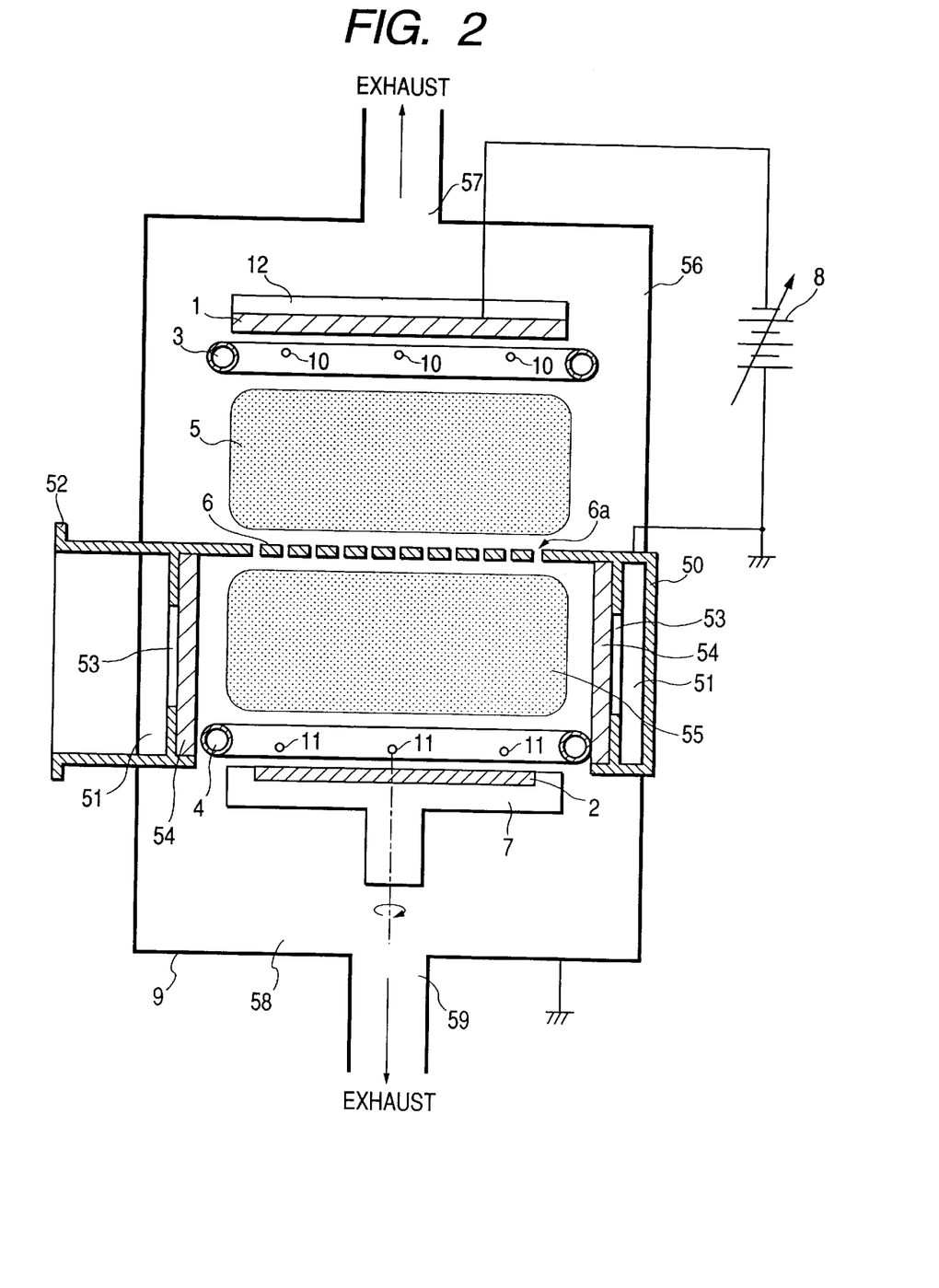
FIG. 2 is a schematic cross-sectional view showing a reactive sputtering apparatus according to a preferred embodiment of the present invention.

FIG. 2 is a schematic sectional view illustrating a reactive sputtering apparatus according to a preferred embodiment of the present invention.

The reactive sputtering apparatus shown in FIG. 2 comprises a substrate holder 7 as a substrate holding means for holding a substrate 2, a target holder 12 as a target holding means for holding a target 1 selected as a raw material, a gas shower head 3 as a sputtering gas supplying means for supplying a sputtering gas into a reaction chamber 9, and a gas shower head 4 which is provided as occasion demands as a reaction gas supplying means for supplying a reaction gas. This apparatus further comprises a power supply 8 which is used as power supplying means for supplying an electric power required for generating plasma by electric discharge in a space between the target 1 and the substrate 2. A grid plate 6 is provided between the target 1 and the substrate 2 as a partition member having a plurality of openings 6a. A microwave supplying means for supplying a microwave into a space is provided between the grid plate 6 and the substrate 2. As the microwave supplying means in the embodiment shown in FIG. 2, there are used a cylindrical slot antenna 50 having a plurality of slits 53 formed in its inside wall and a rectangular waveguide 52. Openings 10 for supplying a sputtering gas and openings 11 for supplying a reaction gas are provided as occasion demands at locations apart from each other so as to supply the sputtering gas into the space between the target 1 and the grid plate 6, and supply the reaction gas into the space between the substrate 2 and the grid plate 6.

It is preferable to separately provide, as occasion demands, an exhaust opening 57 for evacuating a space 56 above the grid plate 6 and an exhaust opening 59 for evacuating a space 58 under the grid plate 6. Further, a microwave is introduced into the space between the grid plate 6 and the substrate 2 by way of a dielectric window 54 to cause electric discharge.

Figure 3:
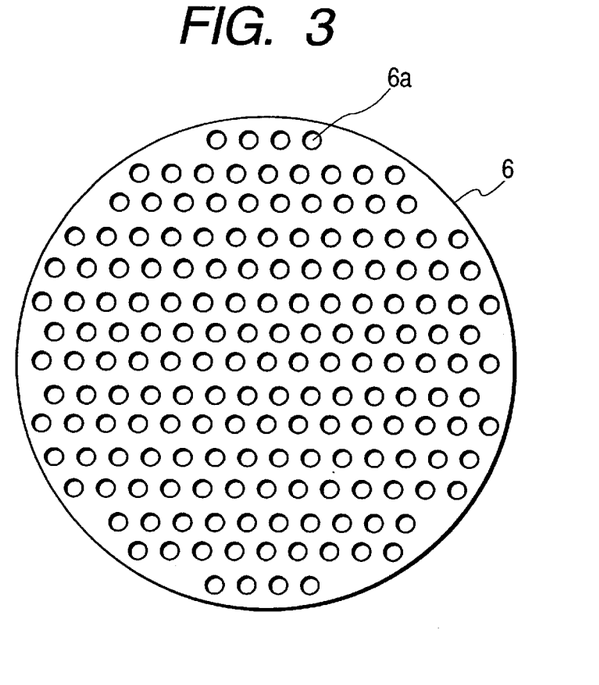
FIG. 3 is a plan view showing a partition member to be used in the reactive sputtering apparatus according to the present invention.

FIG. 3 is a plan view for showing one example of the grid plate 6 used in the present invention. It is preferable to select a material for at least a surface 6c of the grid plate 6 dependently on a material for a film to be formed. For example, when a film of magnesium fluoride is to be formed, it is preferable to use a conductive member coated with magnesium or magnesium fluoride or a conductive member comprising magnesium. Silicon or a conductive member coated with silicon oxide is used for forming a film of silicon oxide, tantalum or a conductive member coated with tantalum oxide or is used for forming a film of tantalum oxide, and aluminium or a conductive member coated with aluminium oxide is used for forming a film of aluminium oxide. A material for at least the surface of the grid plate is selected from materials such as silicon oxide, silicon, tantalum oxide, tantalum, aluminium oxide, aluminium, magnesium fluoride, magnesium, indium oxide, titanium nitrate, titanium, copper oxide, copper and the like. When a grid plate coated with a compound is to be used, it is possible to use a plate-like base member made of a conductive or semiconductive material selected independently of a material of a target and coat the surface of the base member with a coating of a material which is same as that of the target or a thin film of a compound to be formed.

The aspect ratio of the plurality of openings 6a provided in the grid plate 6 is preferably below 1.0, more preferably below 0.6. Such an aspect ratio suppresses mutual dispersion of gases and allows a film to be formed at an adequate depositing rate, thereby making it possible to obtain a film having uniform thickness over an entire surface.

A three dimensional form of the opening as seen from the upper side of the grid plate may be cylindrical or pyramidal, and a shape on a plane, i.e., a shape of an aperture (two dimensional shape), of the opening may be circular, elliptic, rectangular, triangular or the like.

An aspect ratio AR of the opening 6a is defined as a value (D/L) obtained by dividing a depth D of the opening (thickness of the plate) by a diameter L of a true circle having the same area as that of the aperture. Further, the diameter L is preferably 1% to 15% of the substrate 2, more preferably 4% to 10% of a diameter of the substrate 2.

In order to obtain a uniform film, it is preferable that the plurality of openings 6a of the grid plate 6 are regularly distributed. In order to form a uniform thin film having a large area at an adequate depositing rate, the aperture ratio of the grid plate is preferably 20% to 95%, more preferably 50% to 95%.

More preferably, sputtering is carried out in a condition where the grid plate 6 is maintained at a predetermined potential so as to generate a potential difference between the grid plate and the target. It is preferable to bias the grid plate 6 to a potential higher than that of the substrate 2. Such a bias serves for lessening impacts on a film caused by anions which penetrate the substrate from a plasma. Though a sputtering rate can be enhanced by increasing the electric power to be supplied, such enhancement will allow an excessive amount of sputtered atoms to jump into the substrate, thereby heating it excessively. Such overheating is impermissible for forming a film on the substrate which should not be thermally deformed. In this embodiment, it is possible to solve such a problem by using the grid plate which captures a part of the sputtered atoms.

Further, the partition member is not limited to the plate-like member having the openings but may be a mesh-like member.

It is desirable that the sputtering gas supply opening 10 is provided in a plurality in the vicinity of the target 1 so as to surround the target 1 as shown in FIG. 2. In the apparatus shown in FIG. 2, a plurality of the sputtering gas supply openings 10 are provided on a side of the target 1 from a center of the supply tube so that the gas is blown out preferentially toward the target 1. The sputtering gas supply openings 10 are arranged nearly at equal intervals on the gas shower head 3 which is an annular supply tube. In other words, it can be said that the plurality of sputtering gas supply openings 10 are arranged symmetrically along the circumference of the supply tube.

Similarly, it is desirable that a plurality of the reaction gas supply opening 11 is also provided in the vicinity of the substrate 2 so as to surround the substrate 2. In the apparatus shown in FIG. 2, the reaction gas supply openings 11 are provided on a side of the substrate 2 from the center of the supply tube so that the gas is blown out preferentially toward the surface of the substrate. The reaction gas supply openings 11 are arranged at nearly equal intervals on the gas shower head 4 which is an annular supply tube. In other words, it can be said that the plurality of supply openings are arranged symmetrically along the circumference of the supply tube.

The substrate holding means 7 is provided to be rotatable at 1 to 50 rpm during sputtering. The rotation of the substrate holding member 7 serves for forming a film more uniformly.

A magnetic field generating means may be provided in the target holder 12 to carry out reactive magnetron sputtering. Such means is effective to enclose the plasma of a sputtering gas in the vicinity of a target.

As the power source 8, in addition to a DC power source, an AC power source can be used. As an AC power source, an RF power source of, for example 13.56 MHz may be used and a DC bias voltage may be overlapped as occasion demands.

The exhaust openings 57 and 59 provided in a top surface and a bottom surface of the reaction chamber 9 are connected to an evacuating pump not shown in the drawings. The evacuating pump can be composed by combining a turbo molecular pump or a cryopump for main evacuation with a rotary pump or the like for preevacuation.

Though the target 1 is arranged at an upper part of the apparatus and the substrate is arranged at a lower part of in the apparatus shown in FIG. 2, this positional relationship may be inverted, or the substrate may be arranged at the upper part so that the surface of a film to be formed faces downward and the target may be arranged at the lower part so that the surface of the target to be sputtered faces upward. Alternately, the substrate and the target which are planar plates may be arranged in erected positions so that the surface of a film to be formed and the surface of the target to be sputtered are not horizontal.

Figure 4:
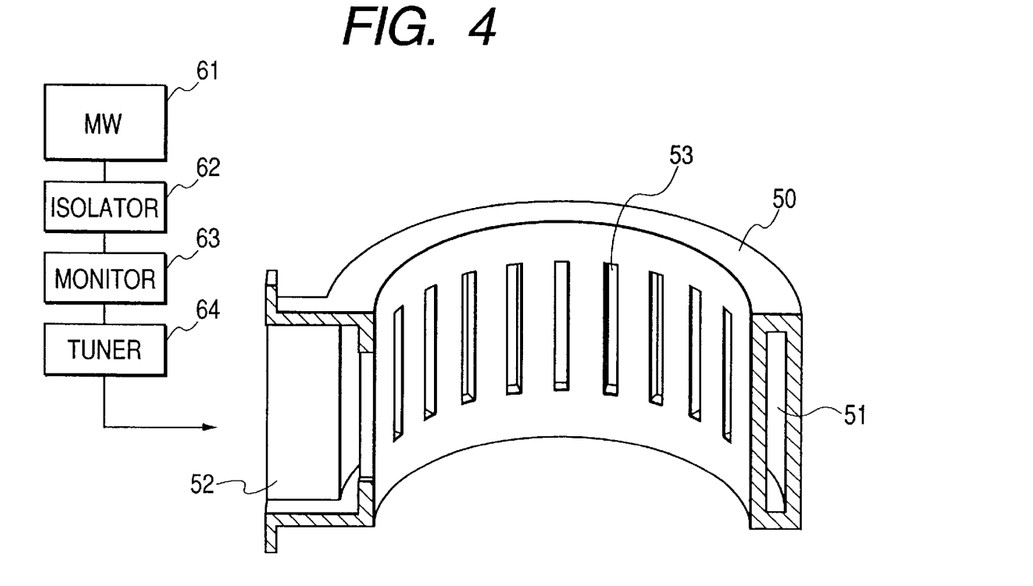
FIG. 4 is a schematic diagram for explaining a microwave supplier to be used in the reactive sputtering apparatus according to the present invention.

FIG. 4 is a schematic diagram for explaining a microwave supplier which is to be used in the present invention. An annular multi-slot antenna 50 used as microwave supply means is composed of a rectangular waveguide bent and jointed as shown in FIG. 4.

A microwave generated from a microwave oscillator 61 propagates to an inlet section 52 of the rectangular waveguide by way of adjustment means such as an isolator 62, a power monitor 63, and a tuner 64 and then propagates through an internal space 51 of the antenna 50, whereafter the microwave is radiated from a plurality of slots 53.

Figure 5:
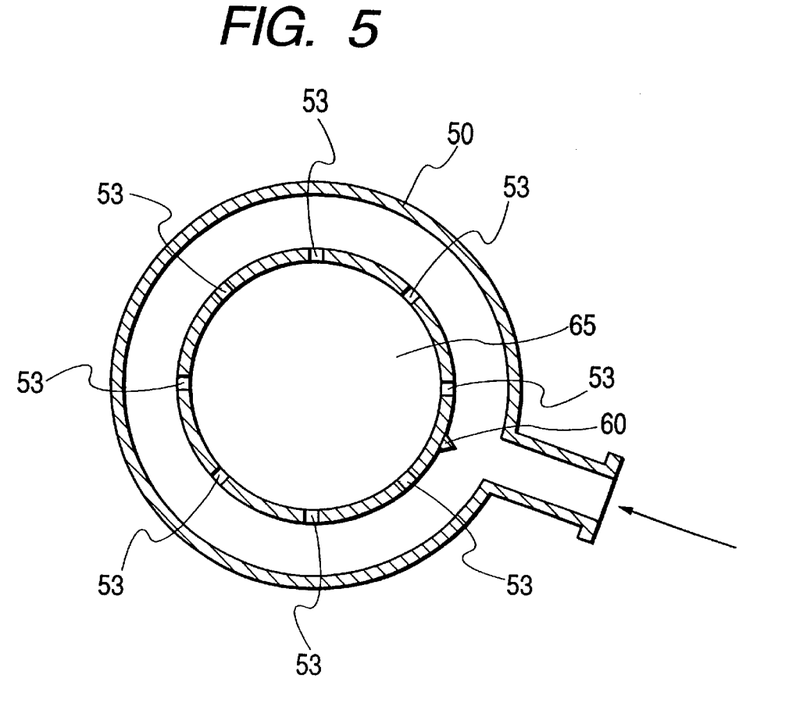
FIG. 5 is a sectional view of the microwave supplier to be used in the present invention.

FIG. 5 is a sectional view of the multi-slot antenna 50 composed of an endless annular waveguide which is formed so as to have no terminal.

A microwave introduced into the antenna 50 is guided by a distributor 60 so that it propagates clockwise and counterclockwise in the antenna 50, and is radiated from slots 53 to an inside of the antenna.

By adjusting a wavelength of the microwave and a circumferential length of the antenna 50, it is possible to compose a cavity resonance structure which generates a standing wave in the antenna.

Such an endless annular waveguide is described in detail in Japanese Patent Application Laid-Open No. 5-345982, and U.S. Pat. Nos. 5,538,699 and 5,487,875.

It is preferable for the present invention, for example, to use an oscillator of 2.45 GHz and a waveguide of 96 mm×27 mm, define a wavelength $\lambda g$ of a microwave in the waveguide as 158.98 mm and use an endless antenna having a circumferential length which is an integral times as large as $\lambda g$.

In this case, a slot length is $\lambda g/4+\alpha$ ($\alpha$=1 to 2 mm), a slot width is $\lambda g/2$ and slots may be arranged at adequate intervals.

The reactive sputtering apparatus preferred as this embodiment causes an electric discharge in the space between the grid plate 6 and the substrate 2 by the microwave introduced into the space from the slots 53 through the dielectric window 54 made of quartz or alumina, generates a plasma 55 of a reaction gas supplied from the reaction gas supply openings 11. In the space between the target 1 and the grid plate 6, on the other hand, the plasma 5 of a sputtering gas is generated to sputter the target. Active species of the reaction gas in the plasma 55 react with target particles sputtered and passed through the openings 6a on the substrate while migrating, thereby producing a compound.

(Film Formation Method)

Now, description will be made of a method of forming a thin film by using the reactive sputtering apparatus explained above.

First of all, it is necessary to arrange the target 1, the substrate 2 and the grid plate 6 as a partition member in the reaction chamber 9.

Specifically, the grid plate 6 having the plurality of openings is first arranged at a predetermined position in the reaction chamber 9. Then, the target 1 is arranged on the target holder 12. Successively, the substrate 2 is placed on the substrate holder 7.

The upper space 56 and the lower space 58 in the reaction chamber are evacuated, and the substrate 2 is heated as occasion demands.

The sputtering gas is introduced from the supply openings 10 of the gas shower head 3 into the space between the target 1 and the grid plate 6, and the reaction gas is supplied from the supply openings 11 of the reaction gas shower head 4 into the space between the substrate 2 and the grid plate 6.

In a condition where a pressure is preferably maintained at 0.05 to 13 pascals, more preferably 0.1 to 13 pascals, in the reaction chamber, a DC voltage or an RF voltage is applied across the target 1 and the grid plate 6 to cause electric discharge between the target 1 and the grid plate 6, thereby generating the plasma 5 of the sputtering gas. Atoms constituting the target which are sputtered by positive ions in the plasma pass through the openings 6a of the grid plate 6 and reach the surface of the substrate 2. In the space between the grid plate 6 and the substrate 2, the electric discharge of the reaction gas is caused by the microwave which is supplied from the antenna 50. Since active species of the reaction gas which react with the sputtered atoms constituting the target exist in this space, both react on the surface of the substrate, whereby it is possible to form a film containing the atoms of constituting the target and the atoms constituting the reaction gas.

According to this embodiment, since the reaction gas is excited with an energy of the microwave having an incidence energy about 8 eV, a migration of oxygen is accelerated on the substrate and the sputtered particles having a high energy is captured by the grid plate, whereby a minute film free from damage can be formed. Further, the reaction between the active species of the reaction gas and the sputtered atoms constituting the target to take place preferentially on the surface of the substrate since the grid plate can prevent the active species of the reaction gas from flowing to the side of the target. Accordingly, in this embodiment, it is possible to form a thin film having a composition which is rather close to a stoichiometric ratio thereof without lowering a sputtering rate.

The target materials and the surface materials of the partition member include compounds such as $SiO_2$, $Al_2O_3$, $Ta_2O_5$, $InO$, $SnO_2$, $TiN$, $Cu_2O$, $ZnO$, $MgF_2$ and $MgO$; and materials such as Mg, Al, Ta, Si, Ti, Cu, In, Sn and Zn. To further enhance a depositing rate, it is preferable to use a target made of a non-oxide, a non-nitride or a non-fluoride, which include an electrically conductive materials such as of Mg, Al, Ta, Si, Ti, Cu, In, Sn, Zn or the like.

The sputtering gas includes He, Ne, Ar, Kr, Xe or the like.

The reaction gas includes $O_2$, $N_2$, $N_2O$, $F_2$, $NF_3O_3$ or the like.

The substrate may be light-transmissive or may not be light-transmissive. The materials for the substrate include a semiconductor material such as silicon or GaAs, an insulating material such as glass, quartz or fluorite, or a metal such as stainless steel or aluminium.

The present invention can provide formation of thin films of silicon oxide, aluminium oxide, tantalum oxide, indium oxide, tin oxide, titanium nitride, copper oxide, zinc oxide, magnesium fluoride, aluminium fluoride, magnesium oxide and so on.

In particular, the reactive sputtering apparatus according to the present invention is effective to form an optical thin film on a surface of a light-transmissive insulating substrate which has a concave or convex surface, and an optical thin film obtained by the thin film forming method according to the present invention exhibits excellent characteristics as an antireflective film or a reflection enhancing film of an article in a KrF excimer laser or an ArF excimer laser system.

According to the present invention, a depositing rate can be enhanced by sputtering a target with a sputtering gas in which a reaction gas is suppressed, and a minute film can be formed at a large rate by accelerating the reaction of a reaction gas on a surface of a substrate by a microwave plasma. Further, the present invention makes it possible to form a thin film of a compound which is uniform in thickness and optical characteristics or electrical characteristics in the plane of the film. Furthermore, the present invention makes it possible to easily form a thin film of a compound which has a large area.

What is claimed is:

1. A thin film forming apparatus comprising:
   a substrate holding means for holding a substrate;
   a raw material holding means for holding a raw material;

a sputtering gas supply means for supplying a sputtering gas for sputtering the raw material into a reaction chamber;

a reaction gas supply means for supplying a reaction gas; and an electric power supply means for supplying an electric power for causing an electric discharge in a space between the raw material and the substrate, wherein a partition member having a plurality of openings is provided between the raw material and the substrate, wherein a supply opening for the sputtering gas and a supply opening for the reaction gas are provided apart from each other so as to supply the sputtering gas into a space between the raw material and the partition member, and supply the reaction gas into a space between the substrate and the partition member, and wherein a microwave supply means is provided to supply a microwave into the space between the partition member and the substrate, and the microwave supply means is an annular waveguide having a plurality of slots on an inner curved surface thereof provided to surround the space between the partition and the substrate, the microwave is supplied via the slots into the space between the partition and the substrate.

2. A thin film forming apparatus according to claim 1, wherein the openings of the partition member have an aspect ratio below 1.0.

3. A thin film forming apparatus according to claim 1, wherein the partition member is a plate member in which the plurality of openings are regularly distributed.

4. A thin film forming apparatus according to claim 1, wherein the partition member has a surface made of a material which is the same as the raw material or a material of a film to be formed.

5. A thin film forming apparatus according to claim 1, wherein the sputtering gas supply opening is provided in a plurality in the vicinity of the raw material so as to surround the target, and wherein the reaction gas supply opening is provided in a plurality in the vicinity of the substrate so as to surround the substrate.

6. A thin film forming apparatus according to claim 1, wherein the partition member is maintained at a predetermined potential during film formation.

7. A thin film forming apparatus according to claim 1, wherein the substrate holding means is rotatable on a plane.

8. A thin film forming method of forming a thin film of a compound by using an apparatus which comprises a substrate holding means for holding a substrate, a raw material holding means for holding a raw material, a sputtering gas supply means for supplying a sputtering gas for sputtering the raw material into a reaction chamber, a reaction gas supply means for supplying a reaction gas, and an electric power supply means for supplying an electric power for causing an electric discharge in a space between the raw material and the substrate, and a microwave supply means which is an annular waveguide having a plurality of slots on an inner curved surface thereof provided to surround the space between a partition member and the substrate, which comprises the steps of:

providing the substrate and the raw material with interposition of the partition member having a plurality of openings, supplying the sputtering gas into a space between the raw material and the partition member, and supplying the reaction gas into a space between the substrate and the partition member, causing an electric discharge at least between the raw material and the partition member, and supplying a microwave via the slots toward a space between the partition member and the substrate, thereby forming a film containing atoms of the raw material on the substrate.

9. A thin film forming method according to claim 8, wherein the openings of the partition member have an aspect ratio below 1.0.

10. A thin film forming method according to claim 8, wherein the partition member is a plate member in which the plurality of openings are regularly distributed.

11. A thin film forming method according to claim 8, wherein the partition member has a surface made of a material which is the same as the raw material or the compound.

12. A thin film forming method according to claim 8, wherein the sputtering gas is supplied from a plurality of supply openings which are provided in the vicinity of the raw material so as to surround the target, and the reaction gas is supplied from a plurality of supply openings which are provided in the vicinity of the substrate so as to surround the substrate.

13. A thin film forming method according to claim 8, wherein sputtering is carried out under a condition of maintaining the partition member at a predetermined potential in film formation.

14. A thin film forming method according to claim 8, wherein sputtering is carried out while rotating the substrate.

15. A thin film forming method according to claim 8, wherein the substrate is a light-transmissive insulating substrate.

16. A thin film forming method according to claim 8, wherein the sputtering gas is at least one kind selected from the group consisting of He, Ar, Ne, Kr and Xe gases.

17. A thin film forming method according to claim 8, wherein the reaction gas contains at least one kind selected from the group consisting of oxygen, nitrogen, fluorine and ozone.

18. A thin film forming method according to claim 8, wherein the reaction gas is $NF_3$ or $F_2$.

19. A thin film forming method according to claim 8, wherein the substrate is a light-transmissive insulating substrate having a concave or convex surface.

* * * * *

UNITED STATES PATENT AND TRADEMARK OFFICE
CERTIFICATE OF CORRECTION

PATENT NO. : 6,238,527 B1
DATED : May 29, 2001
INVENTOR(S) : Kazuho Sone et al.

It is certified that error appears in the above-identified patent and that said Letters Patent is hereby corrected as shown below:

Title page,
Item [56], References Cited, under FOREIGN PATENT DOCUMENTS,
"62056570" should read -- 62-056570 --;
"6041733A" should read -- 6-041733A --; and
"7335553A" should read -- 7-335553A --; and Item [57], ABSTRACT,
Line 9, "openings" should read -- openings is --.

Column 2,
Line 35, "an" should read -- whereby an --; and
Line 45, "minute" should read -- thin --.

Column 3,
Line 49, "OF" (first occurrence) should be deleted.

Column 6,
Line 51, "in" should be deleted.

Column 8,
Line 7, "of" should be deleted;
Line 13, "is" should read -- are --;
Line 29, "an" should be deleted; and "of" should be deleted; and
Line 32, "$NF_3O_3$" should read -- $NF_3, O_3$ --.

Column 9,
Line 24, "substrate," should read -- substrate, and --; and
Line 39, "target," should read -- raw material, --.

UNITED STATES PATENT AND TRADEMARK OFFICE
CERTIFICATE OF CORRECTION

PATENT NO.    : 6,238,527 B1
DATED         : May 29, 2001
INVENTOR(S)   : Kazuho Sone et al.

It is certified that error appears in the above-identified patent and that said Letters Patent is hereby corrected as shown below:

Column 10,
Line 31, "target," should read -- raw material, --.

Signed and Sealed this

Eighteenth Day of June, 2002

Attest:

Attesting Officer

JAMES E. ROGAN
Director of the United States Patent and Trademark Office